(12) United States Patent
Schnitt et al.

(10) Patent No.: US 8,159,032 B2
(45) Date of Patent: Apr. 17, 2012

(54) ELECTRONIC DEVICE COMPRISING AN ESD DEVICE

(75) Inventors: Wolfgang Schnitt, Norderstedt (DE); Kai Neumann, Hamburg (DE); Michael Joehren, Pinneberg (DE)

(73) Assignee: NXP B.V., Eindhoven (NL)

( * ) Notice: Subject to any disclaimer, the term of this patent is extended or adjusted under 35 U.S.C. 154(b) by 1077 days.

(21) Appl. No.: 11/632,511

(22) PCT Filed: Jul. 6, 2005

(86) PCT No.: PCT/IB2005/052243
§ 371 (c)(1),
(2), (4) Date: Feb. 5, 2008

(87) PCT Pub. No.: WO2006/008680
PCT Pub. Date: Jan. 26, 2006

(65) Prior Publication Data
US 2009/0001607 A1    Jan. 1, 2009

(30) Foreign Application Priority Data
Jul. 13, 2004  (EP) ..................................... 04103327

(51) Int. Cl.
*H01L 23/62* (2006.01)
(52) U.S. Cl. ........ 257/355; 257/360; 257/678; 257/786; 257/E23.008; 257/E23.079

(58) Field of Classification Search ........................ None
See application file for complete search history.

(56) References Cited

U.S. PATENT DOCUMENTS

| | | | |
|---|---|---|---|
| 5,895,978 A | 4/1999 | Palagonia et al. | |
| 6,018,183 A | 1/2000 | Hsu et al. | |
| 6,180,426 B1* | 1/2001 | Lin ................................ | 438/15 |
| 6,400,541 B1 | 6/2002 | Brett | |
| 6,710,990 B2* | 3/2004 | Walker et al. .................. | 361/56 |
| 7,251,351 B2* | 7/2007 | Mathiassen et al. .......... | 382/124 |
| 2005/0116331 A1 | 6/2005 | Tsunozaki | |

FOREIGN PATENT DOCUMENTS

| | | |
|---|---|---|
| EP | 0 859 444 | 9/1998 |
| JP | 06 029456 | 2/1994 |
| JP | 2001 185676 | 7/2001 |
| JP | 2002 353396 | 12/2002 |
| WO | WO 02/095817 | 11/2002 |
| WO | WO 2005/053025 | 6/2005 |

* cited by examiner

Primary Examiner — Zandra Smith
Assistant Examiner — Khanh Duong

(57) ABSTRACT

The electronic device comprises an ESD device (20) for protection against electrostatic discharge and provided with suitable protection elements (22) in combination with an integrated circuit (10). The integrated circuit (10) is particularly a so-called bridging circuit or driver circuit for external devices such as SIM cards, memory sticks, USB busses or 12C busses. The ESD device (20) is provided with a chip scale package in that the bumps (40) can be placed on a printed circuit board directly. The integrated circuit (10) is stacked on the ESD device (20).

16 Claims, 4 Drawing Sheets

ELECTRONIC DEVICE COMPRISING AN ESD DEVICE

The invention relates to an electronic device comprising a semiconductor device and an electrostatic discharge (ESD) device or circuit for protection of the semiconductor device.

Semiconductor devices, and integrated circuits in particular, need protection against undesired interference. The protection level herein continuously increases both in view of legal requirements and of the increased sensitivity of the integrated circuits as a consequence of the shrinking dimensions. One of the undesired interferences is the electrostatic discharge, hereinafter also referred to as ESD. This ESD may occur if a person contacts or approaches one of the entrance ports of the semiconductor device. This is particularly the case in consumer electronics applications that comprise buttons, ports for cables and the like. An electrostatic discharge leads to a pulse of a high voltage going to the integrated circuit. If this is not led away to ground adequately, such a pulse will most probably blow up the integrated circuit.

Conventionally, integrated circuits are protected against ESD either with specific protection circuits that are part of the integrated circuit of with additional discrete semiconductor devices. Both of the conventional solutions have a major disadvantage; the specific protection circuits in the integrated circuits are necessarily large, in view of the voltages and hence the power to be dispensed. This does not match with the trend towards transistors with smaller dimensions and higher densities of such transistors. The discrete devices, such as diodes, are large and require much assembly and an adequately designed printed circuit board.

Additionally, and unfortunately, ESD does not only occur during operation of the device, when person contact one of the entrance ports or a lead connected thereto, and a electrostatic voltage develops between an input and an output. The ESD may occur as well during packaging and assembly of the integrated circuits. The ESD protections with discrete components do not offer any protection thereto, as the discretes are present near the integrated circuit only after the assembly. Hence, their function is rather limited, as the integrated circuits need to have specific protection circuits anyhow.

It is now an object of the invention to provide an electronic device of the kind mentioned in the opening paragraph, which allows for ESD protection during operational use and during packaging and assembly exceeding the widely used standard for on-chip ESD protection by far.

This object is achieved in that the ESD device is an integrated device on a semiconductor substrate. It is provided with first contact pads that are positioned within an IC area on a first surface of the device. It is further provided with second contact pads outside the IC area and on a first surface. At least part of these first contact pads is electrically connected to one of the second contact pads with an interconnect. These second contact pads are suitable for coupling to an external board. Preferably, they have been provided with solder balls for connection to an external board. At least one of which second contact pads is also directly connected to a protection element, that is defined in and/or at the semiconductor substrate. The semiconductor device, preferably an integrated circuit, is assembled on the first surface within the IC area, and contact pads of the integrated circuit being electrically connected to the corresponding first contact pads.

The present invention provides the integrated circuit and the ESD-protection in a stacked die configuration. This results therein that there is no direct connection between the (sensitive) integrated circuit and a printed circuit board. The risk of electrostatic discharge pulses during assembly and packaging is herewith reduced. First of all because all conductors in the ESD device are embedded in insulating material, whereas the conductors on printed circuit boards may well be uncovered. Hence, air discharge is thus less likely. Secondly, the bumps between the ESD device and the integrated circuit are provided with an encapsulant, e.g. an underfill material, whereas the space between a board and an integrated circuit are generally left open. Again, this reduces the risk for air discharge. Thirdly, the ESD device generally carries just one integrated circuit, whereas a printed circuit board may contain other electronic devices at the moment that the integrated circuit is put on the board. Hence, there is no risk of effects between individual devices.

More particularly and preferably, the ESD device of the present invention provides a protection against high discharge pulses, while protection circuits implemented in the integrated circuit will absorb the discharge pulses of lower voltages. Nevertheless, the borderline between high and lower may change. An integrated circuit conventionally has a discharge protection of 2 kV according the Human Body Model (Method MIL883E-3015.7) of contact, and the integrated discrete at least 8 kV of contact (according IEC61000-4-2, Level 4). With the device according to the invention, the discharge protection of the integrated circuit could easily be reduced to 1 kV or 0.5 kV, whereas the ESD device could be made to withstand even pulses of more than 15 kV. This reduction is allowed in that there is not anymore a direct connection between a printed circuit board and the integrated circuit.

It is an advantage of the device of the present invention that it leads to miniaturization. Here is a double effect: in addition to the stacking of the two dies, the size of the ESD-device can shrink. Conventionally, the output was embodied with a solder ball to an external board. In the invention, the output is a bump to the integrated circuit. This bump has a substantially smaller size and pitch, i.e. distance between neighboring bumps.

Additionally, a third effect may be that the size of the integrated circuit is reduced, in that part of the ESD-circuits is displaced to the ESD device. The provision of an integrated circuit on top of a carrier on the basis of a semiconductor substrate has the further advantage that there is substantially no difference between the coefficients of thermal expansion of the integrated circuit and the ESD device. Consequently, bump size and height can be reduced, as bumps usually are needed for the compensation of the different expansion.

The device of the invention is preferably provided as a chip scale package. Solder balls of sufficient size are positioned on the second contact pads in such a package, and an additional encapsulation is absent. The size of the solder balls is sufficient if their height surpasses the height of the integrated circuit plus the height of the contact means between the integrated circuit and the ESD device. If necessary, the integrated circuit may be thinned before assembly to the ESD device. If desired, protrusions can be defined on the semiconductor substrate of the ESD device. Then the requirement on the height of the contact means is reduced effectively. A chip scale package with a stacked die is known per se from U.S. Pat. No. 5,977,640, and particularly FIG. 2 herein. However, that prior art patent does not have a reference to ESD-protection.

Particularly suitable is the stacking of the integrated circuit and the ESD device for those integrated circuits that are in use as bridging circuits, also referred to as drivers. Exchange of data within a consumer electronics device usually occurs at a format of for instance 8 bits. However, other protocols have been set up for exchange with external devices. Such external devices include other ICs (communicating with an I²C-bus), a memory stick, a SD-card, a multimedia card, a USB-device, a keypad, a SIM-card. Bridging circuits are needed for the transformation of the one data format into the other, which transformation usually includes amplification steps and the like. Each bridging circuit may be implemented in an individual integrated circuit, although some of them may be put together.

Now, it is particularly at these entrance locations that the ESD protection for human body discharge is needed. Moreover, the number of I/O-ports of these bridging circuits is not that high, that the routing through a chip scale package with large bumps would require a large space. Next, additional functionality may be included in the ESD device, such as the power control for the driver circuit in the integrated circuit. Finally, a customer desires to have a proper solution for the exchange with other devices. The combination of a ESD device with an integrated circuit with such a bridging function, is one subsystem that offers this solution, so that the customer does not need to worry about it. Moreover, it stimulates the use of such communication systems for alternative applications.

In a further modification, the ESD device comprises at least a first semiconductor element, of which both an input and an output are coupled to the integrated circuit. Such elements are in particular power switches, bipolar transistors and diodes. If integrated in the integrated circuit, the resulting technology is more complex and hence more expensive than the common CMOS technology. For the power switch, this resides in the large dimensions and for the bipolar transistor, it relates to the contacts and the diffusions. However, such elements can be made in the ESD device without many problems. The dimensions of the ESD device are relatively large in view of the voltages to be handled by the protection elements; and bipolar transistors and diodes are commonly used as the protection elements.

In a preferred embodiment, at least one of the second contact pads is connected to ground and provides the grounding for both the ESD circuit and the integrated circuit, which grounding of the ESD circuit being present as a conducting layer or region in the semiconductor substrate. In this manner further miniaturization is achieved, and a proper definition of the grounding for all elements in the device. Moreover, the conducting layer, and with it the complete substrate, will act as a heat spreader in the case of an electrostatic discharge.

In another embodiment, the protection elements are diodes that are coupled to an electrically conducting buried region in the substrate. Diodes that are configured in a backwards direction have a good performance as protection elements. They are fast reacting to voltages above their breakdown voltage employing an avalanche breakdown mechanism. Particularly preferred are Zener diodes. The electrically conducting buried region is excellent for the object of ESD, due to the fact that it can lead the current away easily, in the event of a charge arriving at the ESD diodes. The current is then led to ground through the solder balls. An advantage of this buried region is that it constitutes a ground plane at a short distance from the first surface, and hence provides the interconnects at the first surface with a transmission line character.

In a specific modification hereof, the integrated circuit is suitable for RF, and vertical interconnects extend from the some of the second contact pads to the buried region in the substrate. As the buried region constitutes a good grounding, the shortest connection from the integrated circuit to ground, is that to the buried region. Suitably, the signal pads are positioned with respect to the ground connections such that a coaxial structure is formed. This reduces the impedance losses.

In a further embodiment, one of the interconnects extends at an area of the first surface to which the integrated circuit is assembled, said interconnect providing a reference potential, said reference potential being distributed to at least part of the first contact pads. Due to the position of the reference potential, its distance to the first contact pads is short, and similar or even equal for all. As a consequence, the reference is defined adequately. In the present example, the reference is the supply line. Pull-up resistors with a large value, for instance about 10 kΩ is inserted between the contact pads for I/O functions and the supply line. This enables the use thereof as keypad decoder.

In a further embodiment, at least one of the said interconnects comprises a first track in a first metal layer and a second track in a second metal layer. The use of such a double interconnect reduces the resistance and enables the transfer of power in particular to the integrated circuit without considerable losses.

These and other aspects of the electronic device of the invention will be explained further with respect to the Figures, in which.

The Figures are not drawn to scale and like reference numbers in different figures refer to equal parts.

Figure 1:
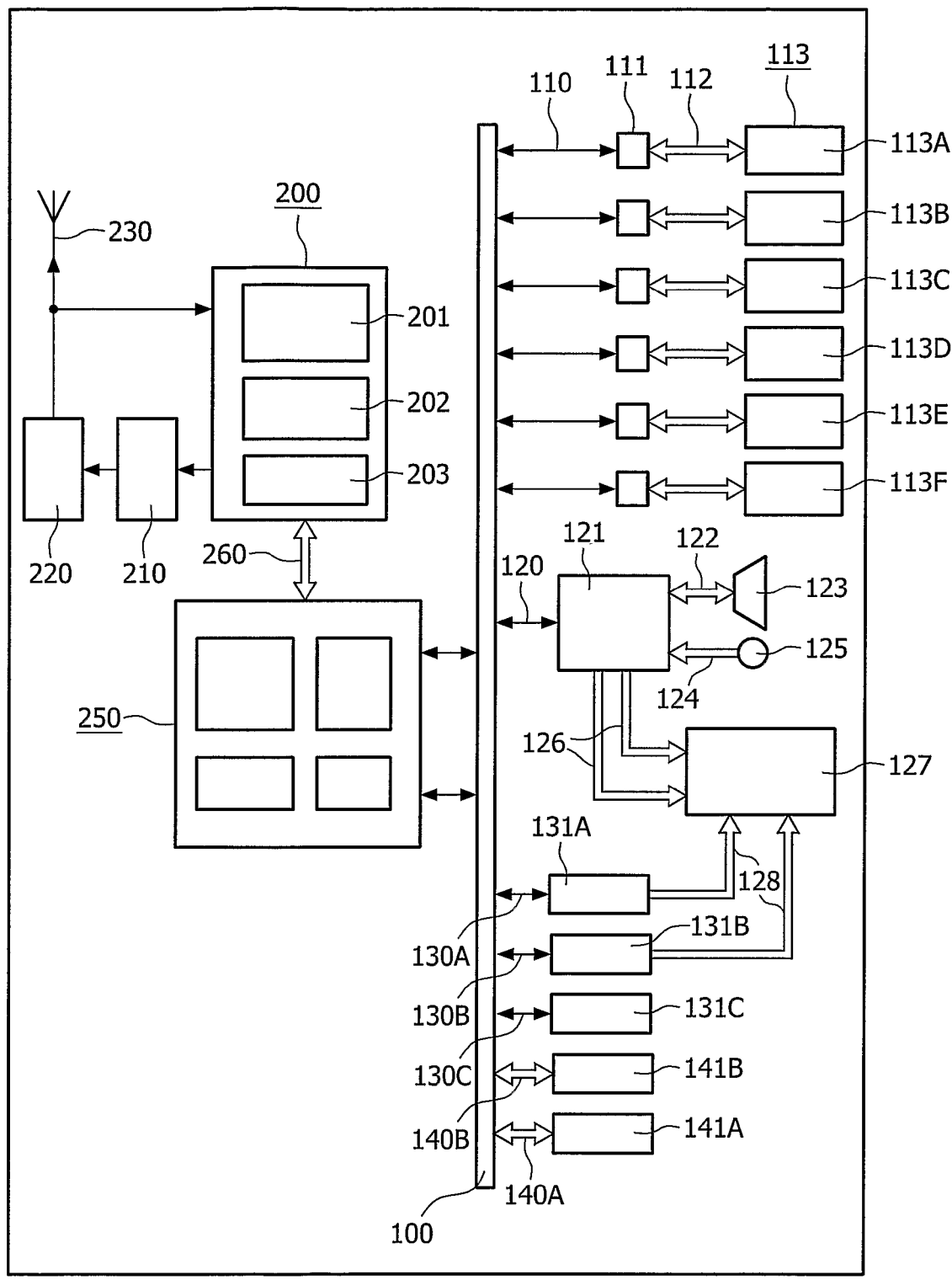
FIG. 1 shows diagrammatically the architecture of a mobile phone.

FIG. 1 shows diagrammatically the architecture of a mobile phone. Basically, there is a division into a operational part, shown left, and a part for connection to external devices, shown right. The division is made with a data line 100, which is the main communication path within the mobile phone. The operational part comprises then a front end part 200 and a baseband part 250. The front end part 200 comprises an RF receiver 201, a synthesizer 202 and a modulator 203. Additionally, it has a driver 210 and a power amplifier 220 for connection to the antenna 230. As will be understood, there are much more components when looked upon in detail, but that is not relevant for the present discussion. The baseband part 250 comprises several parts such as a Baseband Codec, a RISC, a PMU and a DSP.

The interconnect 260 between baseband 250 and front end 200 is ESD-sensitive, although not extremely high. It may well be integrated be part of an interposer comprising also elements for RF functions such as decoupling capacitors and impedance matching filters. At the right hand side, a four fold division can be made. The first class contains the connections 110 to an external device for communication of data 113. The interconnect 112 is present between a bridging circuit 111 and the device 113. Examples of such devices 113 are an I2C bus 113A, a memory stick 113B, a Secure Digital Card 113C, a Multimedia Card 113D, a USB-bus 113E, and a SIM (Subscriber Identity Module)-Card 113F. The bridging circuit 111 generally comprises a signal processor for data transformation from the internal format to the bus format of the external device 113, a driver circuit and if needed an amplifier. All interconnects 112 are very sensitive for ESD pulses, and need to be protected accordingly. The electronic device of the invention allows the bridging circuits 111 to be placed in a stacked die construction with a device for ESD protection.

The second class contains the connection 120 to a voice band codec 121. Specific audio interfaces include the interface 122 to a speaker 123, the interface 124 from a microphone 125, as well as interfaces 126 to a system connector 127. In additional to providing all the normal interface requirement, the design of an audio interface should (1) filter induced signals from long cables, (2) demodulate induced signals by non-linear elements, (3) provide extra ESD protection because of the positioning of transducers upstream of the ESD protections, (4) provide channel resistance in order to match differential channels and (5) allow biasing. These functions can be met with ESD devices including π-filters. In the device of the present invention an analog amplifier is suitable for stacking on the ESD device.

The third class contains the interfaces 130 to internal devices 131, such as a UART bus 131A, a USB bus 131B, both for connection over interconnect 128 to the system connector 127, and a memory 131C. These internal devices are suitable provided in a stacked die configuration with a ESD-protection, if any ESD protection is needed.

The fourth class contains the interfaces 140A,B to user devices present within the mobile phone, such as the keypad 141A, and the display 141B. For such devices, ESD protection is suitably combined with band pass filters, so as to reduce noise. Suitable filter topologies are modified T-filters and π-filters. The modification herein is that diodes are positioned between the supply line and ground additionally to the capacitor. Optionally, the capacitor is even absent, since the capacitance of the diode, often in the order of 70-80 pF, is sufficient. These filters generally comprise resistors. Suitable materials include well known resistor materials such as TiN, TiW, TiWN, SiCr, NiCr, Si, doped polysilicon and Ta. With these materials the full spectrum of resistor values from 20Ω/ to 1 kΩ/ can be implemented.

Figure 2:
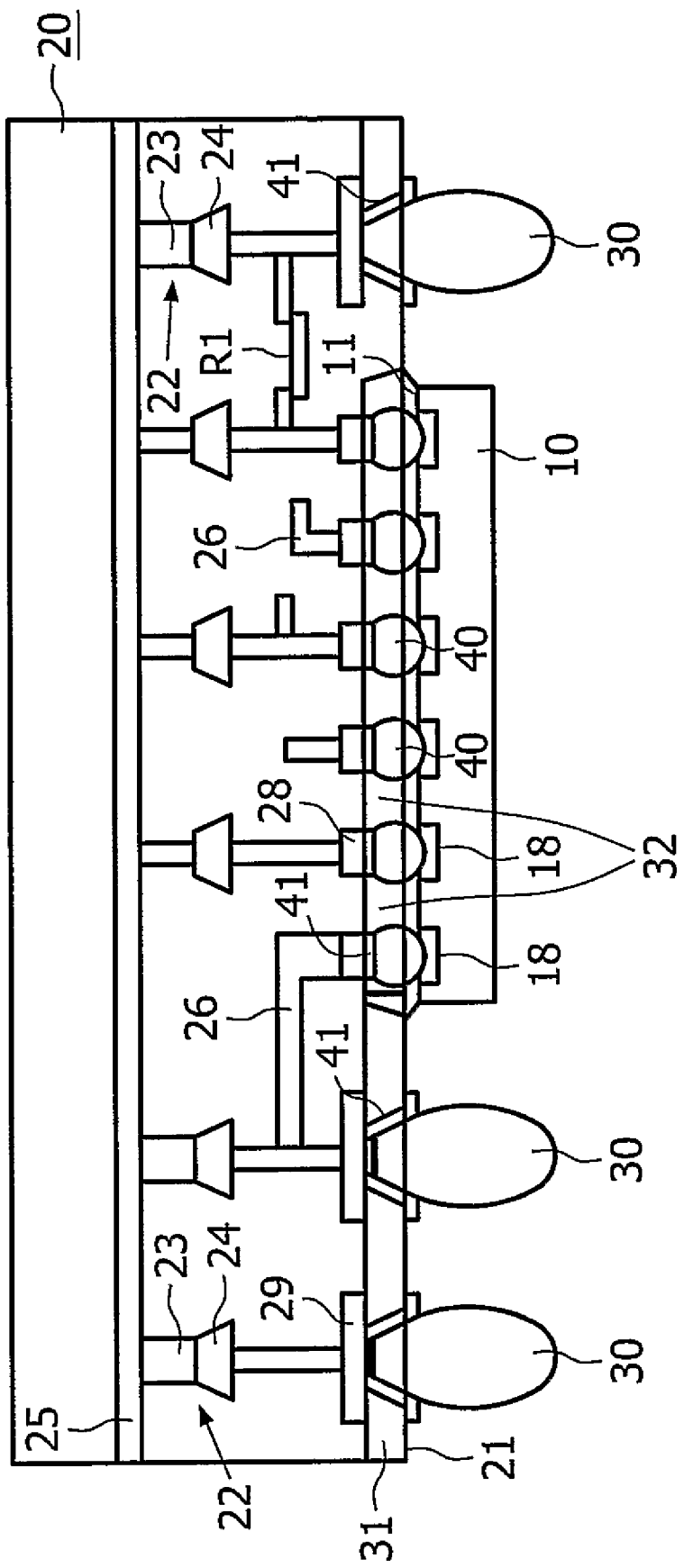
FIG. 2 shows diagrammatically a cross-sectional view of the electronic device.
Figure 3:
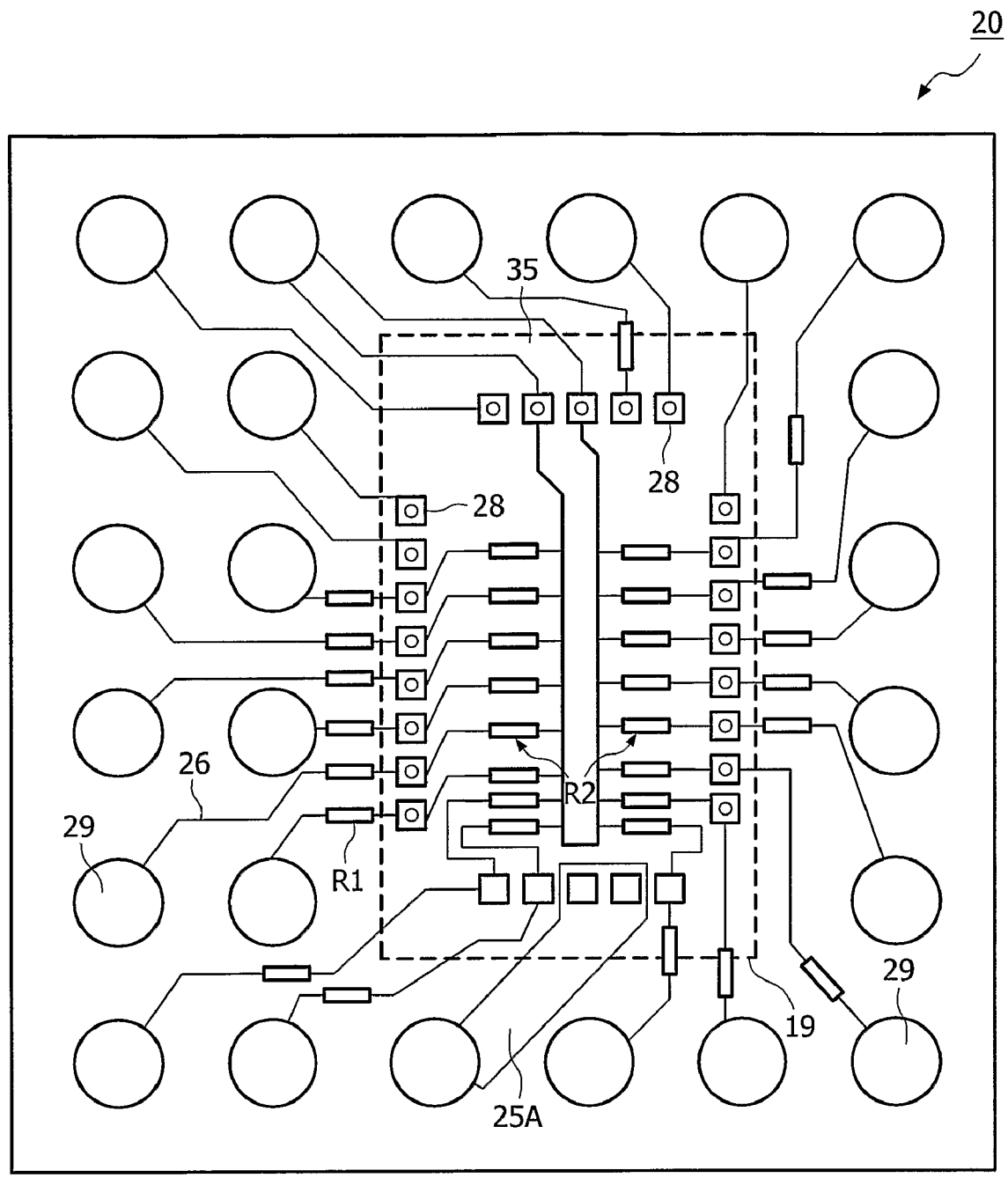
FIG. 3 shows a top view of the ESD device as part of the electronic device.
Figure 4:
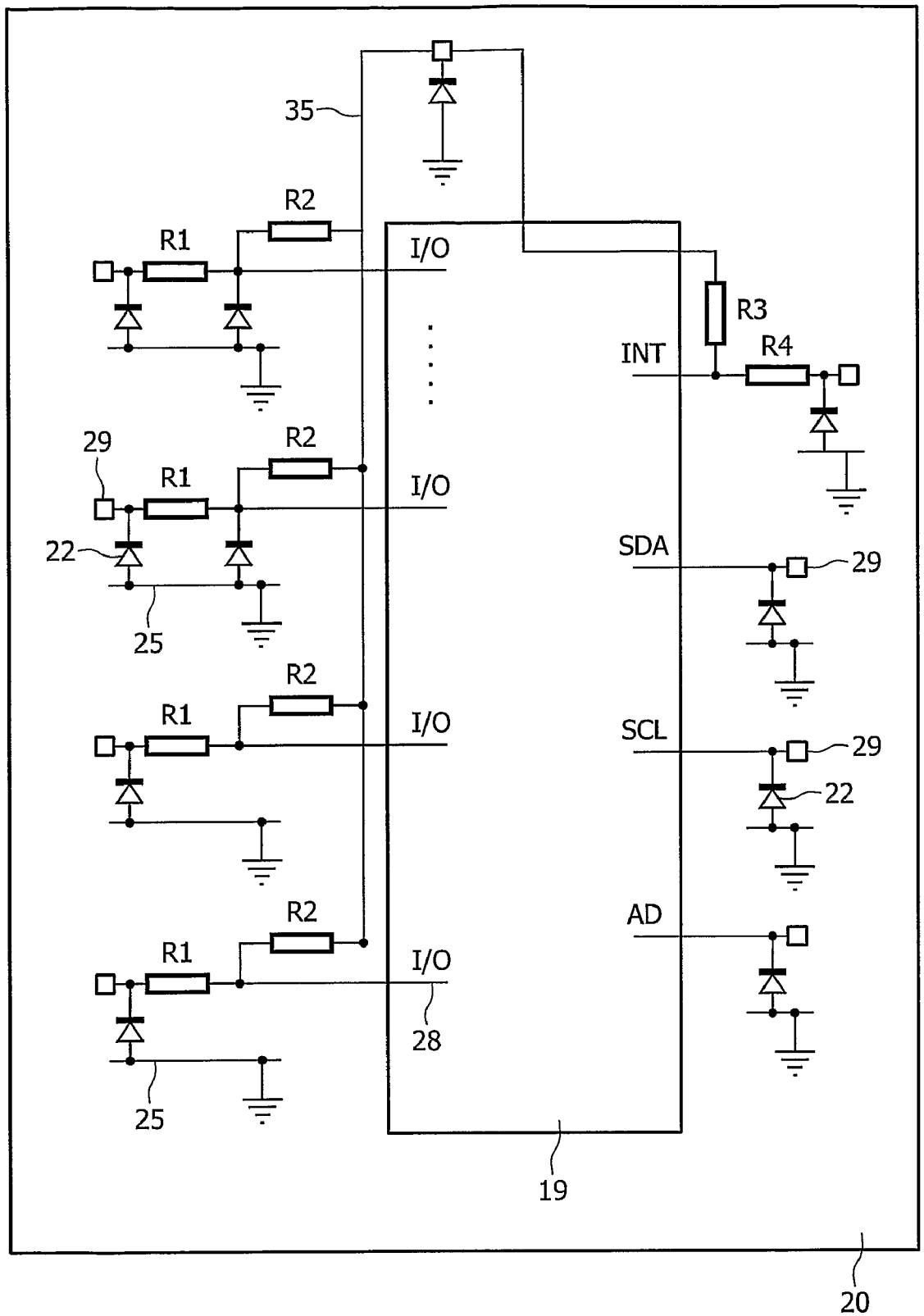
FIG. 4 shows an electrical representation of the electronic device.

FIG. 2 shows diagrammatically a cross-sectional view of the electronic device that comprises the ESD device 20 and a semiconductor device 10. FIG. 3 shows a top view of the ESD device 20 herein, and FIG. 4 shows an electrical representation of the electronic device. In this example, the ESD device 20 is combined with a bridging circuit 111 as shown in FIG. 1. However, alternatively, the semiconductor device 10 can be an amplifier.

The ESD device 20 comprises a first side 21, on which first contact pads 28 and second contact pads 29 are present. At least part of the first and second contact pads 28, 29 are mutually interconnected with an interconnect 26. The majority of these interconnects 26, in particular those connected to an I/O-port, are provided with a resistor R1. The resistor R1 has in this case a value of 100Ω and is constituted by a layer of TiWN. At least part of the second contact pads 29 is directly connected to a protection element 22. This protection element 22 is herein a Zener diode in backward direction. The Zener diode 22 comprises a first region 23 and a second region 24 that are doped with dopants of the opposite type, e.g. n-type and p-type. The bottom region, herein n-type doped, is connected to a well-conducting and highly doped region 25 in the substrate. This region 25 acts as internal ground. It is connected to the ground pad. The size and choice of this diode 22 as protection element in combination with the buried region allows its use as protection element for very high ESD pulses, e.g. of 8 kV or more.

As can be seen, the device 20 is on its contact pads 28,29 provided with an underbump metallisation 41, which is for the first and the second contact pads 28,29 the same. Thereon, a further insulating layer 31 is provided, for instance of benzocyclobutane (BCB) or of polyimide. This insulating layer is patterned so as to be absent in the area of the first contact pads 28.

After the solder balls 30 have been provided on the second bond pads, the integrated circuit 10 is assembled with its first side 11 to the first side 21 of the ESD device. The contact pads 18 of the integrated circuit 10 are therewith provided with a suitable solder material 40, such as PbSn, BiSn, SnAgCu and Au. The height of the bump is for instance 40 μm. Since the thickness of the integrated circuit is approximately 150 μm or can be thinned to such a thickness, and the height of the bumps 30 is about 240 μm, the placement of the bumps 30 is not hindered by the presence of the integrated circuit 10.

After the assembly of the integrated circuit 10 to the ESD device 20 an underfill material 32 is provided to fill the gap between these devices 10,20 and cured as known to the skilled person. Optionally, an underfill material such as an amide or an acrylate may be applied in advance of the assembly. When the assembly is carried out under gentle heating, of for instance 100° C., the underfill material will melt, and the bumps 40 of the integrated circuit 10 sink through this underfill material 32.

FIG. 3 shows in top view the ESD device 20, and FIG. 4 an electrical representation. In this example, the device 20 comprises 16 I/O ports, each of which is also connected to the supply line 38. In between of the supply line and the first contact pads 28, a pull up resistor R2 is present, with in this case a resistance of 10 kΩ. This resistance is suitably embodied in polysilicon. In addition to the I/O ports there are ports for address lines AD, and for the Serial Clock Line SCL and the Serial Data Line SDA. These are ESD protected with a protection element 22, but are not connected to the supply line 35. This supply line 35 is embodied as a interconnect with substantial width and extends below the IC area 19 reserved for the assembly of the integrated circuit 10. As such, it provides a reference potential that is well defined and equal for each I/O port. The INT connection provides an interrupt output and is provided with resistors R3 and R4 of 7.5 kΩ and 50Ω respectively.

Further shown is an interconnect 25A, which is the grounded interconnect. This interconnect provides connections to the buried region 25 at different places within the ESD device. Moreover, the one ground contact pad is used to provide the ground potential both for the integrated circuit 10 and the ESD device 20. In order to isolate the grounding from other interconnects it may well be provided in a separate conducting layer. Moreover, by provision of the interconnects 26 in a conducting layer near to the semiconductor substrate of the ESD device 20, these are provided with a transmission line character as a consequence of the presence of the buried ground region 25.

In case that the ESD device 20 comprises switches and/or other elements such as capacitors that functionally are part of the integrated circuit 10, it is suitable that these are present in the IC area 19.

The present device is different from any conventional device in which the ESD protection is provided on a printed circuit board adjacent to the integrated circuit 10. Particularly, the design of such conventional ESD device would comprise second contact pads for input, and second contact pads for output. In the present device, the output is in fact constituted by the first contact pads 28, which effectively reduces the number of second contact pads with a factor of two. On the other hand, address lines AD, clock signals SDA, SCL and interrupts INT are needed which are absent in the case of a separately provided ESD device.

The invention claimed is:

1. An electronic device comprising:
a semiconductor device on a first surface of an integrated circuit (IC) area of a semiconductor substrate and having contact pads; and
an electrostatic discharge (ESD) circuit for protecting the semiconductor device, the ESD circuit including
first contact pads on the first surface within the IC area and electrically connected to the contact pads of the semiconductor device, and
second contact pads on the first surface and outside the IC area, at least one of the first contact pads being electrically connected to one of the second contact pads with an interconnect, said second contact pads being configured for coupling to an external board, and at least one of the second contact pads being directly connected to a protection circuit in a portion of the semiconductor substrate.

2. An electronic device as claimed in claim 1, wherein solder balls are provided on the second contact pads and configured for connection to an external board.

3. An electronic device as claimed in claim 1, wherein the semiconductor device is a bridging circuit configured to transform data formats and drive signals to an external device.

4. An electronic device as claimed in claim 1, wherein a first portion of each of the first and second contact pads are I/O ports and the interconnects between the first and second contact pads include resistors configured to operate as band pass filters.

5. An electronic device as claimed in claim 1, wherein the protection circuit includes diodes that are coupled to an electrically conducting buried region in the substrate.

6. An electronic device as claimed in claim 1, wherein at least one of the interconnects between one of the first contact pads and one of the second contact pads comprises a first track in a first metal layer and a second track in a second metal layer.

7. An electronic device as claimed in claim 6, wherein an under bump metallization is used as the second metal layer.

8. An electronic device as claimed in claim 1, wherein the interconnect directly connects one of the first contact pads with one of the second contact pads.

9. An electronic device as claimed in claim 1, wherein the interconnect directly connects one of the first contact pads with one of the second contact pads, and directly connects the protection circuit to the one of the first contact pads and to the one of the second contact pads.

10. An electronic device comprising:
a semiconductor device on a first surface of an integrated circuit (TC) area of a semiconductor substrate and having contact pads; and
an electrostatic discharge (ESD) circuit for protecting the semiconductor device, the ESD circuit including
first contact pads on the first surface within the IC area and electrically connected to the contact pads of the semiconductor device, and
second contact pads on the first surface and outside the IC area, at least one of the first contact pads being electrically connected to one of the second contact pads with an interconnect, said second contact pads being configured for coupling to an external board, at least one of the second contact pads being directly connected to a protection circuit in a portion of the semiconductor substrate, and at least one of the second contact pads being connected to ground and configured to provide the grounding for both the ESD circuit and the semiconductor device, which grounding of the ESD circuit being present as a conducting layer or region in the semiconductor substrate.

11. An electronic device as claimed in claim 10, wherein the interconnects between the first and the second contact pads are dimensioned such that they act as striplines/transmission lines.

12. An device comprising:
a semiconductor substrate;
first contact pads that are on a first surface of the substrate and are positioned within an IC area, and configured to attach to a semiconductor device;
second contact pads on the first surface and outside the IC area, at least one of the first contact pads being electrically connected to one of the second contact pads with an interconnect, said second contact pads being configured for coupling to an external board; and
an ESD protection circuit in contact with the substrate and connected to at least one of the second contact pads.

13. The device of claim 12, wherein the interconnect directly connects one of the first contact pads with one of the second contact pads.

14. An electronic device as claimed in claim 12, wherein the interconnect directly connects one of the first contact pads with one of the second contact pads, and directly connects the ESD protection circuit to the one of the first contact pads and to the one of the second contact pads.

15. An electronic device comprising:
a semiconductor device on a first surface of an integrated circuit (IC) area of a semiconductor substrate and having contact pads; and
an electrostatic discharge (ESD) circuit for protecting the semiconductor device, the ESD circuit including
first contact pads on the first surface within the IC area and electrically connected to the contact pads of the semiconductor device, and
second contact pads on the first surface and outside the IC area, at least one of the first contact pads being electrically connected to one of the second contact pads with an interconnect. said second contact pads being configured for coupling to an external board, and at least one of the second contact pads being directly connected to a protection circuit in a portion of the semiconductor substrate, the second contact pads being configured with conductors that extend away from the first surface and beyond the semiconductor device for coupling to an external circuit board, with the semiconductor device being between the external circuit board and the first surface.

16. An ESD device comprising:
a semiconductor substrate;
first contact pads that are on a first surface of the substrate and are positioned within an IC area, and configured to attach to a semiconductor device;
second contact pads on the first surface and outside the IC area, at least one of the first contact pads being electrically connected to one of the second contact pads with an interconnect, the second contact pads being configured with conductors that extend away from the first surface for coupling to an external circuit board, positioned with the semiconductor device between the external circuit board and the first surface; and
an ESD protection circuit in contact with the substrate and connected to at least one of the second contact pads.

* * * * *